United States Patent
Goyal et al.

(10) Patent No.: US 9,362,928 B1
(45) Date of Patent: Jun. 7, 2016

(54) LOW-SPURIOUS FRACTIONAL N-FREQUENCY DIVIDER AND METHOD OF USE

(71) Applicant: Integrated Device Technology, Inc., San Jose, CA (US)

(72) Inventors: Pankaj Goyal, Sunnyvale, CA (US); Jagdeep Bal, Saratoga, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/794,782

(22) Filed: Jul. 8, 2015

(51) Int. Cl.
*H03L 7/06* (2006.01)
*H03L 7/197* (2006.01)
*H03L 7/099* (2006.01)
*H03L 7/093* (2006.01)

(52) U.S. Cl.
CPC ............ *H03L 7/1974* (2013.01); *H03L 7/093* (2013.01); *H03L 7/0995* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 4,862,485 A * | 8/1989 | Guinea ................. | H03L 7/0991 327/159 |
| 5,663,105 A | 9/1997 | Yu et al. | |
| 5,757,240 A | 5/1998 | Boerstler et al. | |
| 5,903,195 A | 5/1999 | Lukes et al. | |
| 6,259,327 B1 | 7/2001 | Balistreri et al. | |
| 6,640,311 B1 | 10/2003 | Knowles et al. | |
| 6,650,193 B2 | 11/2003 | Endo et al. | |
| 6,683,506 B2 | 1/2004 | Ye et al. | |
| 6,727,767 B2 | 4/2004 | Takada et al. | |
| 6,768,387 B1 | 7/2004 | Masuda et al. | |
| 7,012,476 B2 | 3/2006 | Ogiso et al. | |
| 7,323,916 B1 | 1/2008 | Sidiropoulos et al. | |
| 7,405,594 B1 | 7/2008 | Xu et al. | |
| 7,434,083 B1 | 10/2008 | Wilson et al. | |
| 7,541,848 B1 | 6/2009 | Masuda et al. | |
| 7,545,188 B1 | 6/2009 | Xu et al. | |
| 7,573,303 B1 | 8/2009 | Chi et al. | |
| 7,586,347 B1 | 9/2009 | Ren et al. | |
| 7,671,635 B2 * | 3/2010 | Fan ......................... | G06F 7/68 327/105 |
| 7,737,739 B1 | 6/2010 | Bi et al. | |
| 7,750,618 B1 | 7/2010 | Fang et al. | |
| 7,786,763 B1 | 8/2010 | Bal et al. | |
| 7,816,959 B1 | 10/2010 | Isik et al. | |
| 7,907,625 B1 | 3/2011 | MacAdam et al. | |

(Continued)

OTHER PUBLICATIONS

"19-OUTPUT PCIE GEN 3 Buffer", Si53019-A01A, Silicon Laboratories Inc., Rev. 1.1 May 2015, 34 Pages.

(Continued)

*Primary Examiner* — Adam Houston
(74) *Attorney, Agent, or Firm* — Glass & Associates; Molly Sauter; Kenneth Glass

(57) ABSTRACT

A fractional N-frequency divider having a reduced fractional spurious output signal, which utilizes a multi-modulus frequency divider and an accumulator to generate a calibration-timing window that is used to calibrate two oscillator circuits and a phase compensation circuit. The calibrated phase compensation circuit is then used to mitigate the fractional spurs in the output signal of the fractional N-frequency divider. The fractional N-frequency divider may be implemented into a fractional N-frequency synthesizer.

20 Claims, 5 Drawing Sheets

(56) References Cited

U.S. PATENT DOCUMENTS

| | | | |
|---|---|---|---|
| 7,941,723 B1 | 5/2011 | Lien et al. | |
| 8,018,289 B1 | 9/2011 | Hu et al. | |
| 8,164,367 B1 | 4/2012 | Bal et al. | |
| 8,179,952 B2 | 5/2012 | Thurston et al. | |
| 8,259,888 B2 | 9/2012 | Hua et al. | |
| 8,284,816 B1 | 10/2012 | Clementi et al. | |
| 8,305,154 B1 | 11/2012 | Kubena et al. | |
| 8,537,952 B1* | 9/2013 | Arora | H03C 3/0925 375/354 |
| 8,693,557 B1 | 4/2014 | Zhang et al. | |
| 8,704,564 B2 | 4/2014 | Hasegawa et al. | |
| 8,723,573 B1 | 5/2014 | Wang et al. | |
| 8,791,763 B2 | 7/2014 | Taghivand | |
| 2002/0079937 A1 | 6/2002 | Xanthopoulos et al. | |
| 2002/0191727 A1* | 12/2002 | Staszewski | H03C 3/0966 375/376 |
| 2003/0042985 A1 | 3/2003 | Shibahara et al. | |
| 2004/0136440 A1 | 7/2004 | Miyata et al. | |
| 2004/0165691 A1* | 8/2004 | Rana | H03L 7/1976 377/48 |
| 2006/0197614 A1 | 9/2006 | Roubadia et al. | |
| 2006/0290391 A1 | 12/2006 | Leung et al. | |
| 2007/0149144 A1* | 6/2007 | Beyer | H03L 7/081 455/76 |
| 2007/0247248 A1 | 10/2007 | Kobayashi et al. | |
| 2008/0043893 A1* | 2/2008 | Nagaraj | H03K 23/667 375/376 |
| 2008/0104435 A1 | 5/2008 | Pernia et al. | |
| 2008/0129351 A1 | 6/2008 | Chawla et al. | |
| 2008/0246546 A1* | 10/2008 | Ha | H03L 7/0896 331/1 R |
| 2009/0140896 A1 | 6/2009 | Adduci et al. | |
| 2009/0231901 A1 | 9/2009 | Kim et al. | |
| 2009/0256601 A1* | 10/2009 | Zhang | H03L 7/085 327/156 |
| 2009/0262567 A1 | 10/2009 | Shin et al. | |
| 2010/0052798 A1 | 3/2010 | Hirai et al. | |
| 2010/0090731 A1* | 4/2010 | Casagrande | H03C 3/0925 327/148 |
| 2010/0194483 A1 | 8/2010 | Storaska et al. | |
| 2010/0323643 A1* | 12/2010 | Ridgers | H03L 7/0994 455/118 |
| 2011/0006936 A1 | 1/2011 | Lin et al. | |
| 2011/0285575 A1 | 11/2011 | Landez et al. | |
| 2012/0161829 A1* | 6/2012 | Fernald | H03L 7/085 327/156 |
| 2012/0317365 A1 | 12/2012 | Elhamias et al. | |
| 2012/0328052 A1* | 12/2012 | Etemadi | H04L 27/0014 375/319 |
| 2013/0211758 A1 | 8/2013 | Prathapan et al. | |
| 2014/0029646 A1 | 1/2014 | Foxcroft et al. | |
| 2014/0210532 A1 | 7/2014 | Jenkins | |
| 2014/0327478 A1* | 11/2014 | Horng | H03L 7/08 327/157 |
| 2014/0347941 A1 | 11/2014 | Jose et al. | |
| 2015/0162921 A1* | 6/2015 | Chen | H03L 7/087 327/157 |
| 2015/0180594 A1* | 6/2015 | Chakraborty | H03L 7/0802 455/87 |
| 2015/0200649 A1 | 7/2015 | Trager et al. | |

OTHER PUBLICATIONS

"NB3W1200L: 3.3 V 100/133 MHz Differential 1:12 Push-Pull Clock ZDB/Fanout Buffer for PCIe", On Semiconductor, http://onsemi.com, Aug. 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase-Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

Nagaraju, "A Low Noise 1.5GHz VCO with a 3.75% Tuning Range Using Coupled FBAR's", IEEE International Ultrasonics Symposium (IUS), Oct. 2012, pp. 1-4.

Watanabe, "An All-Digital PLL for Frequency Multilication by 4 to 1022 with Seven-Cycle Lock Time", IEEE Journal of Solid-State Circuits, vol. 39 No. 2, Feb. 2003, pp. 198-204.

* cited by examiner

LOW-SPURIOUS FRACTIONAL N-FREQUENCY DIVIDER AND METHOD OF USE

FIELD OF THE INVENTION

Embodiments of the present invention relate generally to frequency synthesizers, and more particularly to mitigating fractional spurs in a fractional N-frequency divider for use in a fractional N-frequency synthesizer.

BACKGROUND OF THE INVENTION

In many modern electronic systems, it is necessary to generate multiple output signals at various output frequencies, from one single frequency reference signal. To achieve the desired frequency resolution for modern electronic systems, fractional N-frequency synthesizers are used. In fractional-N frequency synthesizers, a fractional N-frequency divider and associated circuitry are used to establish a division ratio having a fractional component by periodically changing the division ratio of the divider, so that an average value of the output frequency contains a fractional element.

It is known in the art that the use of fractional N-frequency dividers results in undesirable fractional spurs in the output signal of the fractional N-frequency divider. The fractional spurs are a result of the required periodic switching between the different division ratios of the fractional N-frequency divider. Phase compensation circuits, or phase interpolators, are commonly added to a fractional N-frequency divider to smooth the output signal timing in an attempt to mitigate these fractional spurs. However, the phase interpolator must be properly calibrated to provide adequate mitigation of the fractional spurs.

Accordingly, what is needed in the art is a system and method for calibrating the phase interpolator of a fractional N-frequency divider to provide for necessary mitigation of the fractional spurs of the output signal of the fractional N-frequency divider.

SUMMARY

The present invention provides a system and method for calibrating the phase compensation circuit of a fractional N-frequency divider to provide for necessary mitigation of the fractional spurs in the output signal of the fractional N-frequency divider.

In one embodiment, the present invention provides a method for mitigating fractional spurious signals in an output signal of a fractional N-frequency divider, which includes, generating, by an accumulator of a fractional N-frequency divider, a substantially jitter-free calibration time window defined by a carryout signal of the accumulator and a multi-modulus frequency divider output signal of the fractional N-frequency divider. Following the generation of the calibration time window, the method further includes, determining a period of a first oscillator circuit by counting the number of cycles of the first oscillator circuit during the calibration time window, calibrating a second oscillator circuit relative to the first oscillator by adjusting a period of the second oscillator circuit until a difference between the period of the first oscillator circuit and a period of the second oscillator circuit is equal to a desired differential period between the first oscillator circuit and the second oscillator circuit, calculating, for each of a plurality of accumulator control words from the accumulator, a calibration control word using the first oscillator circuit, the calibrated second oscillator circuit and a phase compensation circuit of the fractional N-frequency divider and calibrating the phase compensation circuit of the fractional N-frequency divider to modify each of the plurality of accumulator control words to generate a modified control word that is used to reduce the fractional spurious signals in the output signal of the fractional N-frequency divider.

In an additional embodiment, the present invention provides a fractional N-frequency divider having a reduced fractional spurious output signal. The fractional N-frequency divider includes a multi-modulus frequency divider to receive an input signal and to generate a fractional frequency divider output signal. The fractional N-frequency divider further includes, an accumulator coupled to receive the fractional frequency divider output signal from the multi-modulus frequency divider, the accumulator to provide a carryout signal to the multi-modulus frequency divider, wherein the multi-modulus frequency divider and the accumulator are configured to generate, in response to the input signal, a substantially jitter-free calibration time window defined by the carryout signal of the accumulator and the multi-modulus frequency divider output signal. The fractional N-frequency divider further includes, an oscillator calibration circuit coupled to the accumulator, the oscillator calibration circuit for determining a period of a first oscillator circuit by counting the number of cycles of the first oscillator circuit during the calibration time window and for calibrating a second oscillator circuit relative to the first oscillator circuit by adjusting a period of the second oscillator circuit until a difference between the period of the first oscillator circuit and a period of the second oscillator circuit is equal to a desired differential period between the first oscillator circuit and the second oscillator circuit and a phase compensation calibration circuit coupled to the accumulator, the phase compensation calibration circuit to calculate, for each of a plurality of accumulator control words, a calibration control word using the first oscillator circuit, the calibrated second oscillator circuit and a phase compensation circuit of the fractional N-frequency divider and the phase compensation calibration circuit to calibrate the phase compensation circuit of the fractional N-frequency divider using the calibration control word for each of the plurality of accumulator control words, to reduce the fractional spurious signals in the fractional N-frequency divider output signal.

The present invention additionally includes, a fractional N-frequency synthesizer comprising, a phase detector to receive a reference input signal, a loop filter coupled to the phase detector, a voltage controlled oscillator coupled to the loop filter and a fractional-N frequency divider coupled to the voltage controlled oscillator and coupled to the phase detector. The fractional N-frequency divider further includes, a multi-modulus frequency divider to receive an input signal and to generate a fractional frequency divided output signal, an accumulator coupled to receive the divided output signal from the multi-modulus frequency divider to receive a input fraction word value, the accumulator to provide a carryout signal at an output to control the multi-modulus frequency divider, wherein the multi-modulus frequency divider and the accumulator can be configured during a calibration process, to generate, in response to the input signal, a substantially jitter-free calibration time window defined by the carryout signal of the accumulator and the multi-modulus frequency divider output signal. The system may further include, an oscillator calibration circuit coupled to the accumulator, the oscillator calibration circuit for determining a period of a first oscillator circuit by counting the number of cycles of the first oscillator circuit during the calibration time window and for calibrating a second oscillator circuit relative to the first oscillator circuit by adjusting a period of the second oscillator circuit until a difference between the period of the first oscillator circuit and a period of the second oscillator circuit is equal to a desired differential period between the first oscillator circuit and the second oscillator circuit and a phase compensation calibration circuit coupled to the accumulator, the phase compensation calibration circuit to calibrate a phase compensation circuit of the fractional N-frequency divider using the calibrated first oscillator circuit, the calibrated second oscillator circuit and a phase compensation control word from the accumulator, to reduce the fractional spurious signals in the output signal of the fractional N-frequency divider. The phase compensation control word is determined during the calibration of the phase compensation circuit.

Accordingly, the present invention provides a system and method for calibrating the phase compensation circuit of a fractional N-frequency divider to provide for necessary mitigation of the fractional spurs of the output signal of the fractional N-frequency divider.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

The present invention provides a system and method for calibrating the phase interpolator of a fractional N-frequency divider to provide for necessary mitigation of the fractional spurs in the output signal of the fractional N-frequency divider.

Modern communication technology requires improved PLL-based frequency synthesizers to meet the increasing demands of wireless and wired communication systems. For PLLs based upon a frequency synthesizer, the integer-N frequency synthesizer was widely used, however, the output minimum frequency step of an integer-N frequency synthesizer is limited by the input reference frequency. In order to achieve smaller output frequency steps, an integer-N frequency synthesizer would need to utilize a smaller input reference frequency, which results in a larger division ratio and undesirable additional phase noise. Alternatively, a fractional N-frequency synthesizer can be implemented into a communication system which provides an effective frequency divide ratio that is a fractional number, which enables a relatively high frequency input reference signal to be used to achieve fine resolution of frequencies in the synthesizer output signals. The fractional number is typically achieved by periodically changing an integer divide ratio so that a desired fractional number can be approximated.

Figure 1:
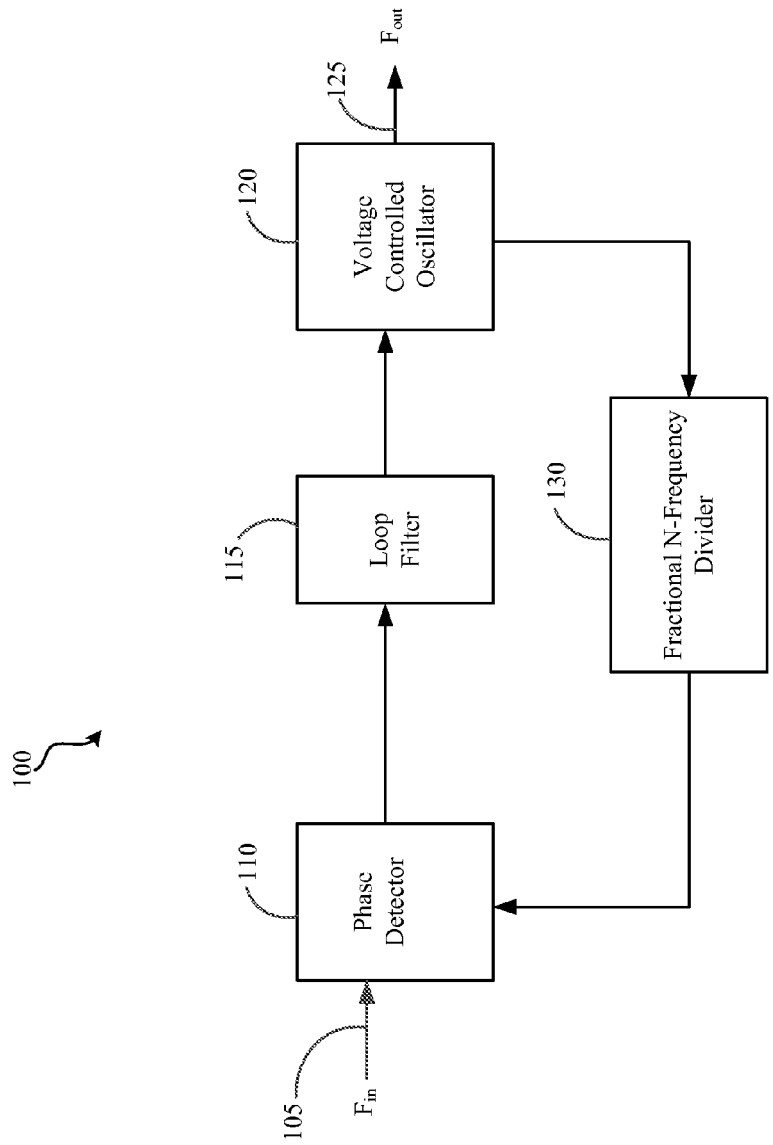
FIG. 1 is a block diagram illustrating a fractional N-frequency synthesizer configured in a phase-locked loop (PLL) configuration.

With reference to FIG. 1, it is known that a fractional N-frequency synthesizer 100 may include a fractional N-frequency divider 130 within a feedback path of a phase-locked loop (PLL). The fractional N-frequency divider 130 may operate by changing the divisor between two adjacent integers, such as N and N+1, to provide an average fractional divisor so that a desired fractional number can be approximated. The phase-locked loop (PLL) may additionally include a phase detector 110, which receives an input reference signal 105, a loop filter 115 and a voltage-controlled oscillator (VCO) 120. In operation, the VCO 120 generates an output signal 125 that is a non-integer multiple of the frequency of the input reference signal 105.

Figure 2:
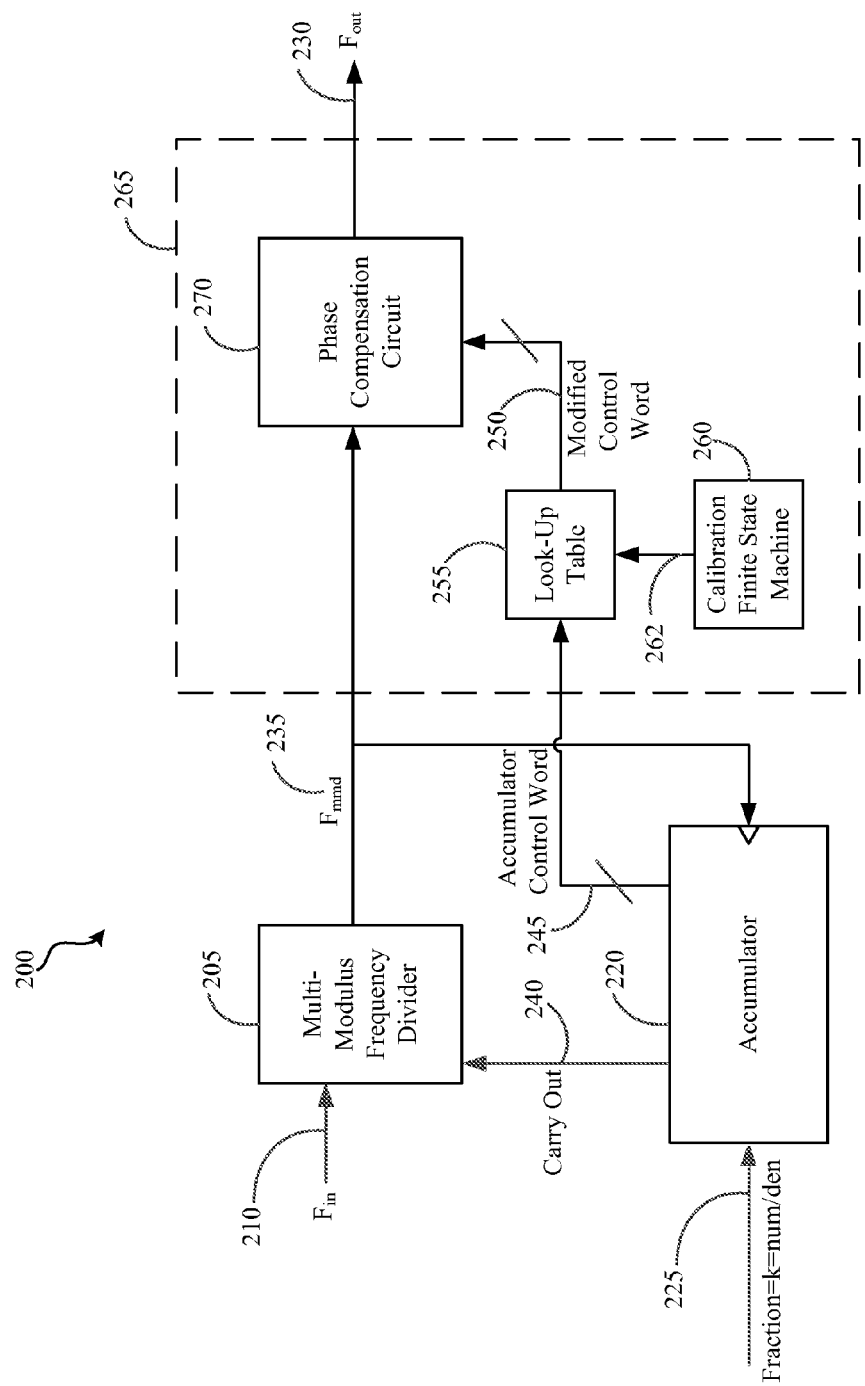
FIG. 2 is a block diagram illustrating the phase compensation configuration circuit of the fractional N-frequency divider, in accordance with an embodiment of the present invention.

As shown with reference to FIG. 2, a fractional N-frequency divider 200 may include a multi-modulus frequency divider 205 to receive an input signal and to generate a fractional frequency divider output signal and an accumulator 220 coupled to receive the fractional frequency divider output signal 235 from the multi-modulus frequency divider 205 and the accumulator 220 to provide a carryout signal 240 to the multi-modulus frequency divider 205 to dither the output signal to provide a fractional N-frequency output signal 230 from the fractional N-frequency divider 200. In operation, the multi-modulus frequency divider 205 receives an input reference signal 210 and a carryout signal 240 from the accumulator 220 and provides an output signal 235 that has a period that is between N and N+1. The accumulator 220 may be implemented as a simple state machine that changes the main divider value (between N and N+1) during a PLL locked condition. The accumulator 220 receives a input fraction word value 225 and dynamically varies the divide number between N and N+1 in such a way as to provide an averaged divide ratio for the frequency synthesizer that is a fractional number between N and N+1. The function of the accumulator 220 enables the generation of an average division that is a fractional number. For example if the fractional input "k" 225 received by the accumulator 220 is k=0.125 and the multi-modulus frequency divider 205 is designed for N=2 and N+1=3, then the accumulator 220 will control the multi-modulus frequency divider 205 to count the input clock by 2, seven times, and then to count by 3, one time. As such, in this configuration, a repeating sequence contains 17 input clock cycles and 8 output clock edges, which are all timed as a per input clock edge and the average output period is 2.125 times the input clock period. However, this is true only in an average sense and the output clock edges are still coincident with the input clock edges, and do not correspond to the average output clock edges. This results in deterministic jitter, which manifests itself as large spurs in the output signal of the frequency synthesizer. This spur is commonly referred to as a fractional spur and this fractional spur must be mitigated in some manner other than by the loop filter commonly employed in the PLL frequency synthesizer for the communication system to be useful.

The repetitive nature of the sequence of pulses generated by the accumulator 220 and the multi-modulus frequency divider 205 is represented in the accumulator carry out signal 240, which dithers the multi-modulus frequency divider 205.

The carry out signal 240 represents the accumulator overflow. The accumulator control word 245 represents the accumulating phase error in the signal 235 which can be used to mitigate the fractional frequency spur in the output signal 235 of the multi-modulus frequency divider 205. A phase compensation circuit 270, such as a phase interpolator or a controllable delay line circuit, is typically employed to evenly spread the output clock edges to align with desired average output clock period. However, it is well known that phase interpolators are unable to interpolate accurately over a large frequency range. Thus, if a large output frequency range is desired, the fractional spurs can be intolerable in many applications. As such, the phase compensation circuit 270 utilizes the phase information provided by the accumulator control word 245 to adjust the amount of delay added to the output signal 235 of the multi-modulus frequency divider 205 to mitigate the spurs in the output signal 250 of the fractional N-frequency divider 200. However, if the phase compensation circuit 270 is not properly calibrated prior to adjusting the delay of the output signal 235 based upon the accumulator control word 245 from the accumulator 220, errors in the output clock edge timing can result in incomplete mitigation of the deterministic jitter caused by the fractional spurs. In the present invention, spur mitigation is accomplished by providing a calibration control word 262 from a calibration finite state machine 260 that is generated during a calibration process of the phase compensation circuit 270 to update a look-up table 255. The lookup table 255 then outputs a modified control word 250 which is then used to control the time delay added to the output 235 of multi-modulus frequency divider 205 by the phase compensation circuit 270.

With reference to FIG. 2, in accordance with the present invention, a fractional N-frequency divider 200 having a mitigated fractional spurious output signal is provided, which includes a phase compensation calibration circuit 265 coupled to the multi-modulus frequency divider 205 and the accumulator 220. In operation, the phase compensation calibration circuit 265 calibrates the phase compensation circuit 270 and the calibrated phase compensation circuit 270 adds a known phase shift (i.e. time delay $\Delta_t$) to the multi-modulus frequency divider output signal 235, wherein the amount of phase shift is dependent upon a modified control word 250. As such, in the present invention, the phase compensation calibration circuit 265 utilizes the control word 262 from the calibration finite state machine 260 to generate a modified control word 250 from a look-up table 255 to adjust the delay added to the output signal 235 of the multi-modulus frequency divider 205 to further mitigate the fractional spurs in the output signal 230. As such, for each accumulator control word 245, the calibration control word 262 calculated by the calibration finite state machine 260 modifies the accumulator control word 245 using the look-up table 255 to provide a modified control word 250 that provides the correct compensation to be applied for each step of the phase compensation circuit 270. The calibration control words 262 calculated by the calibration finite state machine 260 adjust for the non-linearity of the phase compensation circuit 270 and are determined by measuring the actual delay added by the phase compensation circuit 270 as compared to the expected delay specified by the look-up table 255.

If the phase shift that is added to the multi-modulus frequency divider control output 235 by the phase compensation circuit 270 does not correspond to the accumulator control word 245, the phase compensation circuit 270 is said to be non-linear or in error. These errors can be corrected by calibrating the phase compensation circuit 270. Calibration of the phase compensation circuit 270 includes measuring the actual time shift introduced by the phase compensation circuit 270, comparing the actual time shift to the expected time shift based upon the accumulator control word 245 for the specific accumulator step and modifying the accumulator control word 245 provided to the phase compensation circuit 270 using the control words 262 computed by the calibration finite state machine 260 to update a look-up table 255 to generate a modified control word 250 to compensate for the error introduced by the non-linear phase compensation circuit 270. The values stored in the look-up table 255 may represent the offset, or difference, between the actual time shift and the expected time shift of the phase compensation circuit 270, or alternatively, the values stored in the look-up table 255 may represent the complete modified control word 250. In a preferred embodiment, the offset values are stored in the look-up table 255 to reduce the chip area required for storage of the values. As such, in the present invention, during calibration of the phase compensation circuit 270, for each accumulator control word 245 provided by the accumulator 220, a modified control word 250 is generated which is a combination of the accumulator control word 245 and the calibration control word 262. The modified control word 250 is then used during the operation of the N-frequency divider 200 to reduce the fractional spurs.

For a fractional N-Frequency divider, a mechanism to generate a modified control word 250 is needed that provides sub-LSB resolution. In an exemplary embodiment, for a VCO frequency of 2500 MHz, corresponding to a VCO period of 400 ps (pico seconds), the maximum delay introduced by the phase compensation circuit 270 is greater than 400 ps, plus the fixed circuit delay due to the inherent phase compensation circuit and commonly used filtering capacitors. As such, for a phase compensation circuit 270 having 256 phase (or time) steps, there are 256 entries in the look-up table 255. Assuming that each entry in the look-up table 255 comprises 4 bits, the total number of bits in the look-up table 255 is 1024, which can be stored in an 8-word RAM block having 8 bits per word using a total of 16 RAM blocks. As such, the delay change per frequency step of the phase compensation circuit 270 is 400 ps/256=1.5625 ps, indicating a LSB (least significant bit) of 1.5625 ps. Assuming a 0.25 LSB error target of 0.39 ps, the required number of counts for the delay measurement circuit using simple ring oscillators in a known vernier based delay measurement configuration can be determined.

In order to provide the desired sub-pico-second resolution from the phase compensation circuit 270, the phase or delay change per frequency step provided by the phase compensation circuit 270 must correspond to the control word from the look-up table 255. To correct errors resulting from the non-linearity of the phase compensation circuit 270, the actual time shift in the output signal of the phase compensation circuit 270 is measured against the expected time shift corresponding to a particular control word. The measured differences are then provided to a calibration finite state machine 260. The calibration finite state machines 260 then calculates a calibration control word 262, that is then used to update the look-up table 255 to generate a modified control word 250 to compensate for the error attributed to the phase compensation circuit 270. To determine the calibration control word 262 for the calibration finite state machine 260 the actual delay attributed to the phase compensation circuit 270 must be measured. The actual time shift, or delay, of the phase compensation circuit 270 can be measured using two oscillator circuits, wherein a slower oscillator, having a first period, is triggered by the input of the phase compensation circuit 270 and a faster oscillator, having a second period that is shorter than the first period of the slower oscillator, is triggered by the output of the phase compensation circuit 270 to measure the delay for each of the control words from the look-up table 235. However, it is known that oscillator circuits, such as free running ring oscillators, may introduce process, voltage, temperature (PVT) dependent errors when used for calibration of the phase compensation circuit 270. As such, while the range of measurement of the delay of the phase compensation circuit 270 is limited by the maximum delay as determined by the period of the faster oscillator, the resolution of the measurement is limited by the difference in periods of the two oscillators. It is difficult to improve the minimum resolution of the oscillators due to the process variations and even very closely placed oscillators can vary widely in their oscillation periods from part-to-part. Additionally, the two oscillators used to measure the delay of the phase compensation circuit 270 must be placed at a minimum separation in the integrated circuit layout so that they do not injection lock with each other. As such, it is important that these two oscillators used to calibrate the phase compensation circuit 270 run at different frequencies, but these frequencies must be very close to each other, to provide suitable resolution. In other words, the period of the slower oscillator and the period of the faster oscillator need to be very close to each other for good resolution and in particular, the difference between the period of the slower oscillator and the period of the faster oscillator needs to be accurately known to achieve a well-defined resolution for calibration of the phase compensation circuit 270.

Oscillator circuits, and particularly free running oscillators, are noisy but the jitter from the oscillators is averaged out if the measurement count is very large. Additionally, it is known that further improvement in measurement accuracy can be achieved by averaging such measurements. Process variations can be calibrated out of the oscillator by using a reference signal to calibrate the faster oscillator and the slower oscillator. Additionally, if the average supply voltage does not change during the calibration time, the voltage dependent frequency drift is typically not a concern and temperature variations are anyway much slower compared to the time duration of the entire calibration, unless the oscillators are placed too close to very high power circuitry. To calibrate an oscillator circuit, such as a ring oscillator, the clocks of the oscillator circuit can be counted within a calibration window defined by a clean clock source. The calibration window can be generated by a long chain of divide-by-2 counter circuits, however, extremely large counter circuits are needed for generating a long enough time counting window for the oscillator calibration, for measuring and correcting the ring oscillator frequencies and for measuring the delay of the phase compensation circuit. Such large counter circuits are undesirable in area constrained, low cost integrated circuit designs.

Figure 3:
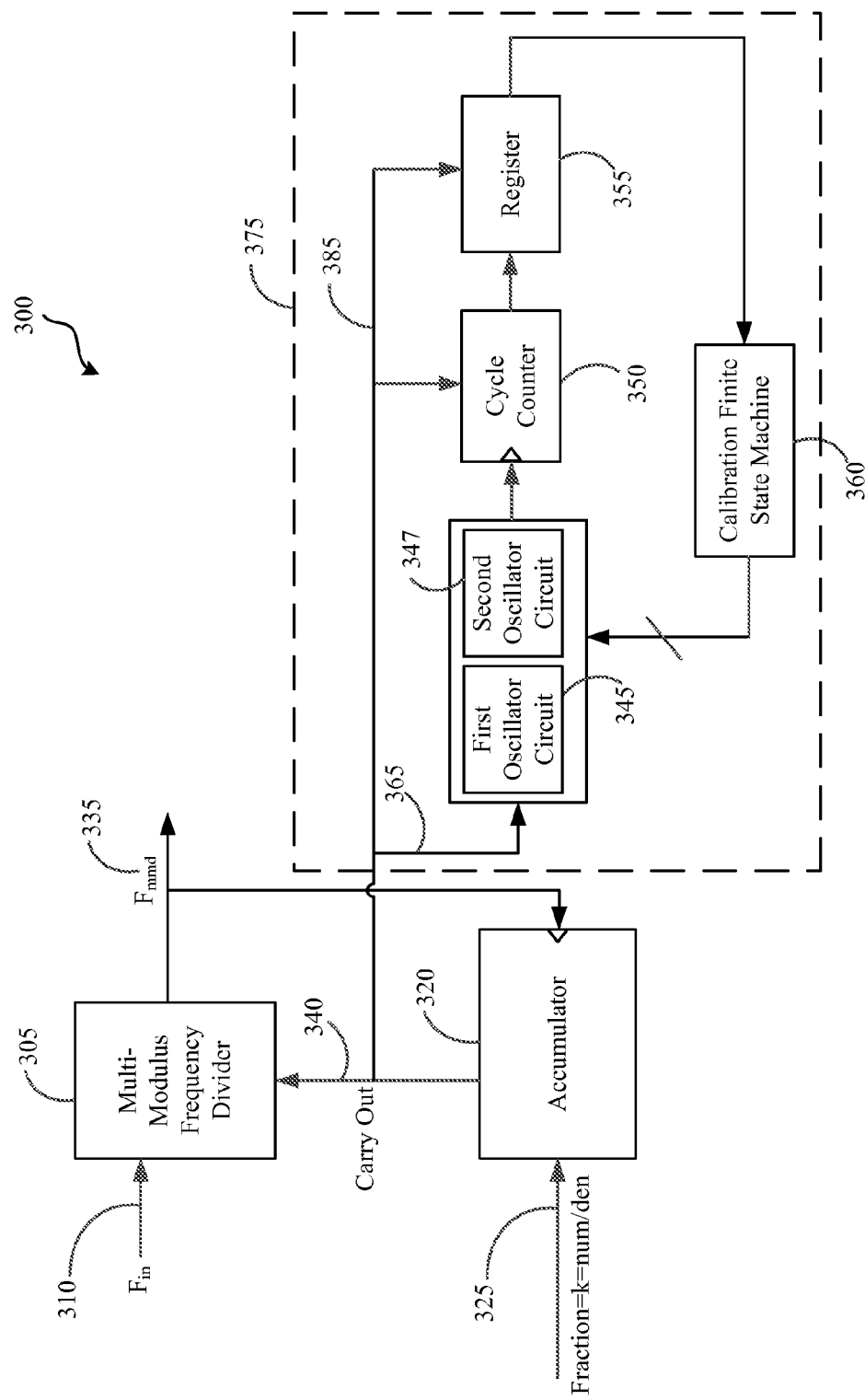
FIG. 3 is a block diagram illustrating the oscillator calibration circuit of the fraction N-frequency divider, in accordance with an embodiment of the present invention.

With reference to FIG. 3, in the present invention, the fractional N-frequency divider 300 includes a multi-modulus frequency divider 305 to receive an input signal 310 and to generate a fractional frequency divider output signal 335 and an accumulator 320 coupled to receive the fractional frequency divider output signal 335 from the multi-modulus frequency divider 305, the accumulator 320 to provide a carryout signal 340 to control the multi-modulus frequency divider 305, wherein the multi-modulus frequency divider 305 and the accumulator 320 are configured to generate, in response to the input signal 310, a substantially jitter-free calibration time window 385 defined by the carryout signal 340 of the accumulator 320, the multi-modulus frequency divider output signal 335, and the fraction word 325 input to the accumulator 320. In the present invention, a closed form expression for the spur frequency offset from the desired output frequency is determined, resulting in a simple sequence, wherein the period of the output signal 335 of the multi-modulus frequency divider 305 is a deterministic, substantially long sequence. The repetitive nature of the sequence of pulses is faithfully represented by the carry out signal 340 of the accumulator 320, which dithers the multi-modulus frequency divider 305. As such, by appropriately choosing the value of N and the numerator and denominator of the fraction "k" input to the accumulator 325, a substantially long clean timing signal can be generated by the fractional N-frequency divider 300 for the purpose of calibrating the oscillator circuits that are used to calibrate the phase compensation circuit. During calibration of the phase compensation circuit, the multi-modulus frequency divider 305 is not in normal use in the system, and as such, the multi-modulus frequency divider 305 can be used to generate the clean timing signal to calibrate the oscillator circuits 345, 347 within the oscillator calibration circuit 375. With the multi-modulus frequency divider 305 and the accumulator 320 configured to generate a long, fractional sequence, the carry out signal 340 from the accumulator 320 repeats after a sufficiently long time interval, such that even after reasonable counting errors, an oscillator outputs a sufficiently large number of pulses and can be calibrated with a negligible frequency error. This error is further mitigated by averaging the results of multiple such measurements.

In the present invention, the fractional N-frequency divider 300 includes an oscillator calibration circuit 375 coupled to the accumulator 320. The oscillator calibration circuit 375 may include a first oscillator circuit 345, a second oscillator circuit 347, a cycle counter 350, a register 355 and a calibration finite state machine 360. The oscillator calibration circuit 375 is configured for determining a period of a first oscillator circuit 345 by using the cycle counter 350 to count the number of cycles of the first oscillator circuit 345 during the calibration time window 385 and for calibrating a second oscillator circuit 347 relative to the first oscillator circuit 345 by adjusting a period of the second oscillator circuit 347 until a difference between the period of the first oscillator circuit 345 and a period of the second oscillator circuit 347 is equal to a desired differential period between the first oscillator circuit 345 and the second oscillator circuit 347. The register 355 may be used to store and average the cycle count from the cycle counter 350 and the averaged count is used by the calibration state machine 360 to determine and adjust the period of the oscillators 345, 347. The calibration finite state machine 360 then generates a frequency tuning control word that is fed back to the second oscillator circuit 347 to calibrate the second oscillator circuit 347 relative to the first oscillator circuit 345. While the first oscillator circuit 345 and the second oscillator circuit 347 could be calibrated separately and then the timing difference between the two oscillators could be determined for the measurement of delay, calibrating the oscillators independently requires significant time and chip area and as a result of the PVT variations, may still not guarantee an accurately measured time difference between the oscillators. Accordingly, in the present invention, the first oscillator circuit 345 is calibrated to a known frequency with a reasonable accuracy and then the second oscillator circuit 347 is calibrated relative to the first oscillator circuit 345. In the present invention, one of the oscillator circuits must be running faster (i.e. shorter period) than the other oscillator circuit (i.e. longer period) to calibrate the phase compensation circuit. The accuracy of the calibration of the phase compensation circuit is dependent upon the difference in the periods of the calibrated oscillator circuits. As such, it is desirable to make the difference between the oscillators very small, while still keeping their known relative speeds, fast vs. slow.

Assuming that the first oscillator 345 is the fast oscillator and the second oscillator 347 is the slow oscillator, during the calibration of the oscillators, the fast oscillator must always remain faster than the slow oscillator (i.e. the period of the fast oscillator must always be less than the period of the slow oscillator). The order of calibration of the oscillators is unimportant, either the fast oscillator can be calibrated first, or the slow oscillator can be calibrated first, as long as the relative speeds are maintained.

Figure 4A:
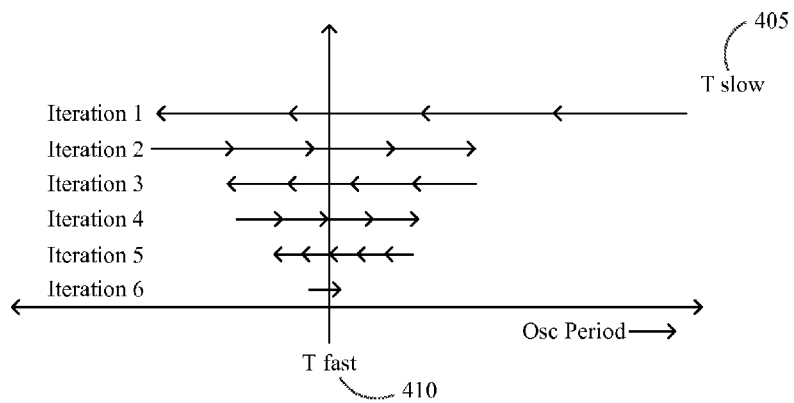
FIG. 4A is a block diagram illustrating the calibration of the second oscillator circuit relative to the first oscillator circuit, in accordance with an embodiment of the present invention.

With reference to FIG. 4A, in an exemplary embodiment, assuming the fast oscillator 410 is calibrated first, then for the slower oscillator 405, it is initially ensured that the slower oscillator 405 is much slower than the fast oscillator 410 and the frequency of the slower oscillator is then gradually increased such that the difference between the period of the slow oscillator and the period of the fast oscillator approaches zero. After calibrating the fast oscillator 410, the tuning control is set such that the slow 405 oscillator is definitely known to be slower than the fast oscillator 410. In order to ensure that the period of the slow oscillator 405 is not decreased below the period of the fast oscillator 410, as the frequency of the slower oscillator 405 is increased the relative speed of the two oscillators can be determined by measuring the number of counts of the oscillators. In one embodiment, measuring the number of counts of the oscillators may be accomplished by sequentially using a counter to measure the number of counts. Alternatively, in another embodiment, the phase inversion may be determined using a phase detector during the calibration process. In case of a phase detector based implementation, the rate of repetition of detected pulses from phase detector output indicates whether the two oscillators are getting closer in frequency or further away in frequency. As such, as shown with reference to FIG. 4A, in a first iteration, a tuning step size and a direction is chosen and the frequency of the slow oscillator 405 is increased towards the frequency of the fast oscillator 410. When the frequency of the slow oscillator 405 has overshot and is greater than the frequency of the fast oscillator, the direction of the frequency tuning is reversed and the tuning step size is reduced. This process continues until the difference in frequency between the fast oscillator 410 and the slow oscillator 405 is acceptable for the calibration of the phase compensation circuit. During this process, calibration logic keeps track of the number of times the direction of frequency tuning of the slow oscillator is reversed. When the slow oscillator frequency calibration is stopped, the slow oscillator is indeed slow. In the present invention, the calibration process begins with a larger frequency adjustment step size and the frequency adjustment step size is then reduced each time the tuning direction is changed, thereby significantly reducing the calibration time needed to calibrate the relative period of the two ring oscillators 405, 410. Accurately determining the difference in the period between the two oscillators is critical to the calibration of the phase compensation circuit, so by calibrating the periods of the oscillators against each other, a significant amount of calibration time is saved by calibrating the first oscillator circuit within a reasonable accuracy and spending the majority of the calibration time calibrating the difference in the period between the two oscillator circuits. In addition, as previously discussed, if the two oscillators are too close in frequency, then it is possible that they may injection lock each other if placed close together in the layout for matching reasons, thus deteriorating the quality of the calibration process. However, since the frequencies of the two oscillators are being calibrated by the process of the present invention, it is acceptable to place them reasonably far from each other in the integrated circuit layout.

Following the calibration of the first oscillator circuit 345 and the second oscillator circuit 347 relative to each other, the difference between the period of the first oscillator circuit 345 and the second oscillator circuit 347 is known and can be used to calibrate the phase compensation circuit 270. As such, the phase compensation calibration circuit 265 of FIG. 2 is configured to calibrate the phase compensation circuit 270 of the fractional N-frequency divider 300 using the first oscillator circuit 345, the calibrated second oscillator circuit 347 and a first known phase compensation control circuit word 245 from the accumulator 220, to reduce the fractional spurious signals in the output signal 230 of the fractional N-frequency divider 200.

Figure 4B:
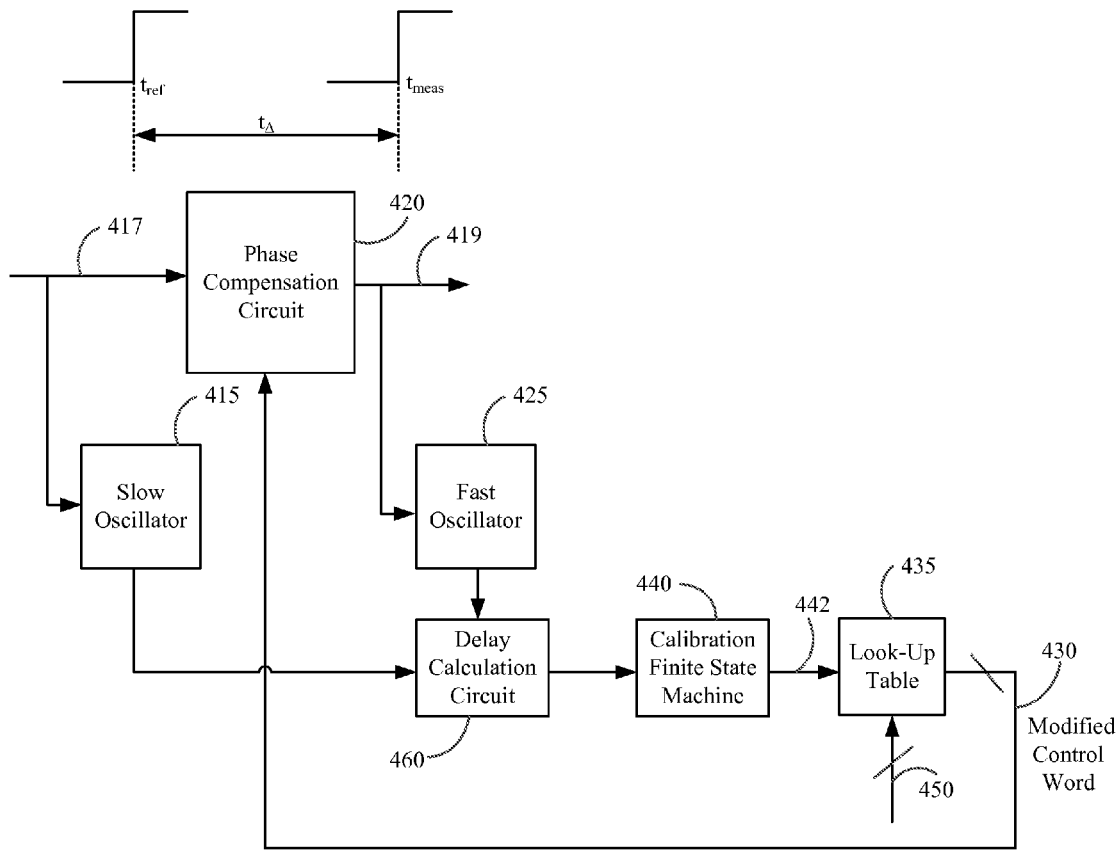
FIG. 4B is a block diagram illustrating the measurement of the delay of the phase compensation circuit, in accordance with an embodiment of the present invention.

With reference to FIG. 4B, in one embodiment for calibration of the phase compensation circuit 420, the multi-modulus frequency divider can be configured to temporarily provide an integer output during the calibration process, the phase compensation control word can be overridden and the phase compensation control word can be set for a reasonably large expected time delay, thereby forcing the carry over signal from the accumulator to a predetermined value. The slower oscillator 415 enable signal is triggered from the signal 417 at the input of the phase compensation circuit 420 and the faster oscillator 425 enable signal is triggered from the signal 419 at the output of the phase compensation circuit 420. The accumulator control word 450 from the accumulator is set to a known fixed control word and the signal propagation time delay (tΔ) through the phase compensation circuit is measured by a delay calculation circuit 460. If the measured time delay matches the expected delay as determined by the accumulator control word 450, then it is determined that the phase compensation circuit 420 is calibrated for that control word and the process continues with the next phase step setting. Alternatively, if the measured time delay does not match the expected time delay, then calibration FSM 440 alters the look-up table entry from the look-up table 435, and hence the modified controlled word 430 for that particular accumulator word 450 until the measured delay through the phase compensation circuit 420 is acceptable. The look-up table 435 then retains the information representing the calibrated time error in phase compensation circuit for this particular control word 450 and the phase compensation circuit 420 is considered calibrated for one accumulator control word 450. Then the accumulator control word is incremented and fixed to next value and the above process is repeated. The process continues until the phase compensation circuit 420 has been calibrated for each of the frequency steps stored in the look-up table 435.

Figure 5:
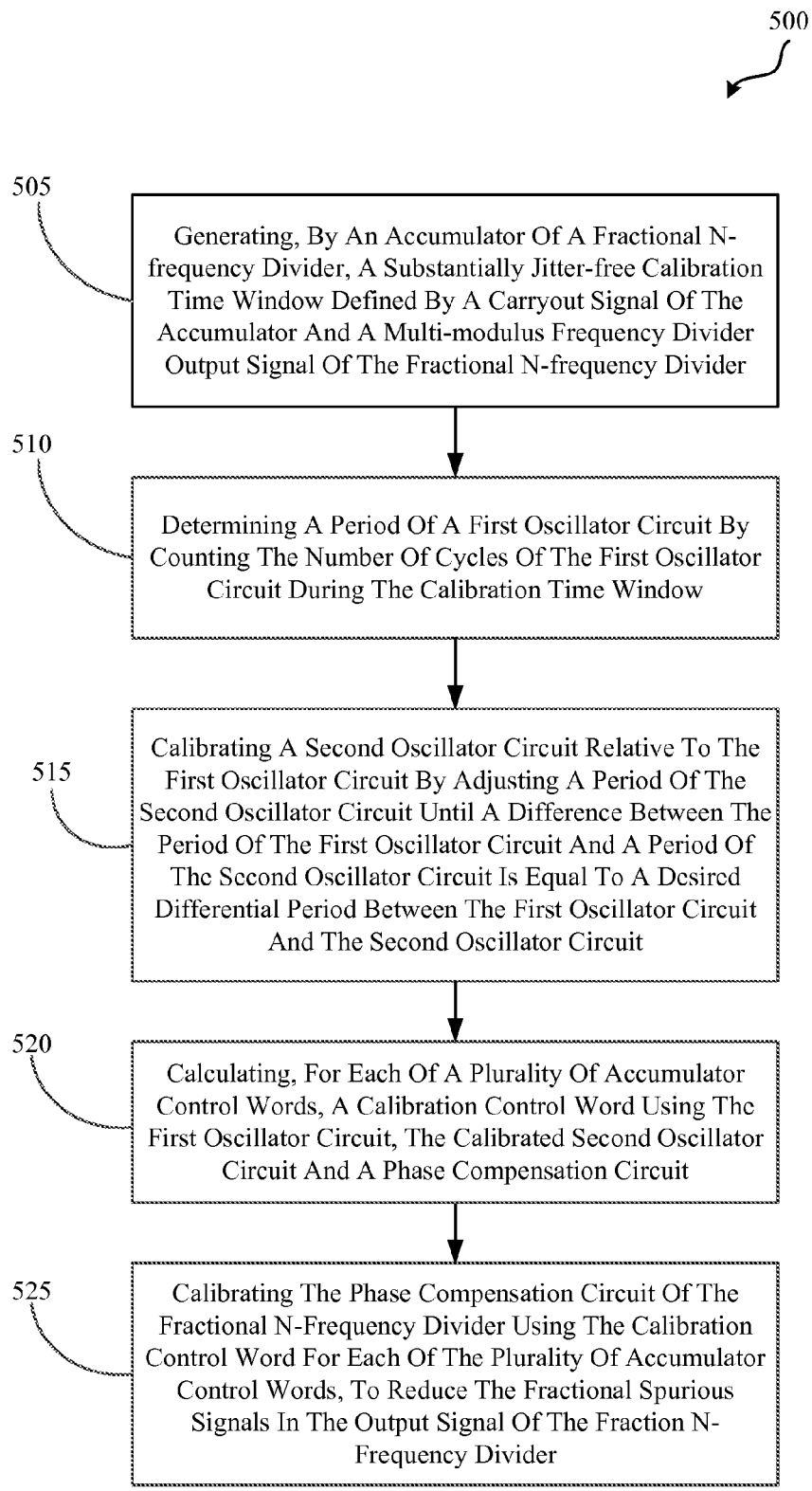
FIG. 5 is a flow diagram illustrating a method for mitigating fractional spurious signals in an output of a fractional N-frequency divider in accordance with an embodiment of the present invention.

With reference to FIG. 5, a method for mitigating fractional spurious signals in an output signal of a fractional N-frequency divider 500 is provided. The method includes, generating, by an accumulator of a fractional N-frequency divider, a substantially jitter-free calibration time window defined by a carryout signal of the accumulator and a multi-modulus frequency divider output signal of the fractional N-frequency divider 505. The step of generating, at an accumulator of a fractional N-frequency divider, a substantially jitter-free calibration time window defined by a carryout signal of the accumulator and a multi-modulus frequency divider output signal of the fractional N-frequency divider 505 may further include, configuring the multi-modulus frequency divider and the accumulator to generate a long fractional sequence wherein the carryout signal of the accumulator repeats following a sufficiently long time interval. In a particular embodiment, the method may include setting an integer division ratio input to be substantially large and setting a denominator of the fractional division ratio to be substantially large to generate the long fractional sequence. With reference to FIG. 2, in one embodiment, a substantially jitter-free calibration time window can be generated by the accumulator 220 in combination with the multi-modulus frequency divider 205 of the fractional N-frequency divider 200.

After the calibration time window has been generated, the method continues by determining a period of a first oscillator circuit by counting the number of cycles of the first oscillator circuit during the calibration time window 510 in method 500. With reference to FIG. 3, in one embodiment, the cycle counter 350 of the oscillator calibration circuit 375 of the fractional N-frequency divider 300 can be used to perform the counting operation for the first oscillator circuit 345.

Following the determination of the period of the first oscillator, the method continues by calibrating a second oscillator circuit relative to the first oscillator circuit by adjusting a period of the second oscillator circuit until a difference between the period of the first oscillator circuit and a period of the second oscillator circuit is equal to a desired differential period between the first oscillator circuit and the second oscillator circuit as in 515. With reference to FIG. 3, in one embodiment, the cycle counter 350 of the oscillator calibration circuit 375 of the fractional N-frequency divider 300 can be used to calibrate the second oscillator circuit 347 relative to the first oscillator circuit 345.

Following the calibration of the second oscillator circuit relative to the first oscillator circuit, the method continues by calculating, for each of a plurality of accumulator control words from the accumulator, a calibration control word using the first oscillator circuit, the calibrated second oscillator circuit and a phase compensation circuit of the fraction N-frequency divider at 520. In one embodiment, calculating the calibration control word 520 may further include, measuring a phase compensation time delay added to the multi-modulus frequency divider output signal by the phase compensation circuit of the fractional N-frequency divider using the first oscillator circuit and the calibrated second oscillator circuit and an accumulator control of the plurality of accumulator control words from the accumulator and comparing the measured phase compensation time delay to an expected phase compensation time delay for the accumulator control word to calculate the calibration control word for each of the plurality of accumulator control words. With reference to FIG. 4B, in one embodiment, the calibration control word 442 is calculated by the calibration finite state machine 440 using input provided by the delay calculation circuit 460. The delay calculation circuit 460 is coupled to the outputs of the slow oscillator 415 and the fast oscillator 425 to measure the actual delay of the phase compensation circuit 420 for each of the plurality of accumulator control words.

Following the calculation of the calibration control word for each of the plurality of accumulator control words at 520, the method continues by calibrating the phase compensation circuit of the fraction N-frequency divider using the calibration control word for each of the plurality of accumulator control words, to reduce the fractional spurious signals in the output signal of the fractional N-frequency divider at 525. Calibrating the phase compensation circuit may further include, updating a look-up-table to adjust the accumulator control word based upon the calibration control word. With reference to FIG. 2, in one embodiment, the calibration control word 262 is used to update the look-up table 255 to generate a modified control world 250 for each of a plurality of accumulator control words 245, that is used calibrate the phase compensation circuit 270.

As previously described, the period of the first oscillator circuit may be less than the period of the second oscillator circuit, or the period of the second oscillator circuit may be less than the period of the first oscillator circuit. In one embodiment, wherein the period of the first oscillator circuit is less than the period of the second oscillator circuit, calibrating a second oscillator circuit relative to the first oscillator circuit may further include, setting the period of the second oscillator circuit to be substantially greater than the period of the first oscillator circuit and incrementally decreasing the period of the second oscillator circuit towards the desired differential period between the first oscillator circuit and the second oscillator circuit such that the period of the second oscillator circuit is equal to a desired value to establish the desired differential period between the first oscillator circuit and the second oscillator circuit. Incrementally decreasing the period of the second oscillator circuit may further include, incrementally decreasing the period of the second oscillator circuit using a first step size tuning step, measuring a phase inversion at an output of a phase detector fed by the two oscillators and when a phase inversion occurs, mitigating the step size of the tuning step to a second step size tuning step, incrementally increasing the period of the second oscillator circuit using the second step size tuning step and continuing the method by measuring a phase inversion, mitigating the step size of the tuning step, and alternatingly incrementally decreasing and incrementally increasing the period of the second oscillator circuit until the period of the second oscillator circuit is equal to a desired value to establish the desired differential period between the first oscillator circuit and the second oscillator circuit.

In an alternative embodiment, wherein the period of the first oscillator circuit is greater than the period of the second oscillator circuit, calibrating a second oscillator circuit relative to the first oscillator circuit may further include, setting the period of the second oscillator circuit to be substantially less than the period of the first oscillator circuit and incrementally increasing the period of the second oscillator circuit towards the desired differential period between the first oscillator circuit and the second oscillator circuit until the period of the second oscillator circuit is equal to a desired value to establish the desired differential period between the first oscillator circuit and the second oscillator circuit. Incrementally increasing the period of the second oscillator circuit towards the desired differential period between the first oscillator circuit and the second oscillator circuit may further include, incrementally increasing the period of the ring oscillator circuit using a first step size tuning step measuring a phase inversion at an output of the first oscillator circuit and at an output of the second oscillator circuit and when a phase inversion occurs, mitigating the step size of the tuning step to a second step size tuning step, incrementally decreasing the period of the second ring oscillator using the second step size tuning step, continuing the method by measuring a phase inversion, mitigating the step size of the tuning step, and alternatingly incrementally increasing and incrementally decreasing the period of the second oscillator circuit until the period of the second oscillator circuit is equal to a desired value to establish the desired differential period between the first oscillator circuit and the second oscillator circuit.

Exemplary embodiments of the invention have been described using CMOS technology. As would be appreciated by a person of ordinary skill in the art, a particular transistor can be replaced by various kinds of transistors with appropriate inversions of signals, orientations and/or voltages, as is necessary for the particular technology, without departing from the scope of the present invention.

In one embodiment, the fractional N-frequency divider 200 may be implemented in an integrated circuit as a single semiconductor die. Alternatively, the integrated circuit may include multiple semiconductor dies that are electrically coupled together such as, for example, a multi-chip module that is packaged in a single integrated circuit package.

In various embodiments, the system of the present invention may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, microcontroller or general-purpose computer.

For purposes of this description, it is understood that all circuit elements are powered from a voltage power domain and ground unless illustrated otherwise. Accordingly, all digital signals generally have voltages that range from approximately ground potential to that of the power domain.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method for mitigating fractional spurious signals in an output signal of a fractional N-frequency divider, the method comprising:
    generating, by an accumulator of a fractional N-frequency divider, a substantially jitter-free calibration time window defined by a carryout signal of the accumulator, a multi-modulus frequency divider output signal of the fractional N-frequency divider and a fraction word input to the accumulator;
    determining a period of a first oscillator circuit by counting the number of cycles of the first oscillator circuit during the calibration time window;
    calibrating a second oscillator circuit relative to the first oscillator by adjusting a period of the second oscillator circuit until a difference between the period of the first oscillator circuit and a period of the second oscillator circuit is equal to a desired differential period between the first oscillator circuit and the second oscillator circuit;
    calculating, for each of a plurality of accumulator control words from the accumulator, a calibration control word using the first oscillator circuit, the calibrated second oscillator circuit and a phase compensation circuit of the fractional N-frequency divider; and
    calibrating the phase compensation circuit of the fractional N-frequency divider using the calibration control word to modify each of the plurality of accumulator control words to generate a modified control word that is used to reduce the fractional spurious signals in the output signal of the fractional N-frequency divider.

2. The method of claim 1, wherein the first oscillator circuit is a ring oscillator circuit.

3. The method of claim 1, wherein the second oscillator circuit is a ring oscillator circuit.

4. The method of claim 1, wherein the phase compensation circuit is a phase interpolator.

5. The method of claim 1, wherein the phase compensation circuit is a delay line circuit.

6. The method of claim 1, wherein calculating, for each of a plurality of accumulator control words from the accumulator, a calibration control word using the first oscillator circuit, the second oscillator circuit, a phase compensation circuit of the fractional N-frequency divider and a fraction word input to the accumulator further comprises:
    measuring a phase compensation time delay added to the multi-modulus frequency divider output signal by the phase compensation circuit of the fractional N-frequency divider using the first oscillator circuit and the calibrated second oscillator circuit and an accumulator control word of the plurality of accumulator control words from the accumulator; and
    comparing the measured phase compensation time delay to an expected phase compensation time delay for the accumulator control word to calculate the calibration control word for each of the plurality of accumulator control words.

7. The method of claim 1, wherein generating, by an accumulator of a fractional N-frequency divider, a substantially jitter-free calibration time window defined by a carryout signal of the accumulator, a multi-modulus frequency divider output signal of the fractional N-frequency divider and a fraction word input to the accumulator further comprises, configuring the multi-modulus frequency divider and the accumulator to generate a long fractional sequence wherein the carryout signal of the accumulator repeats following a sufficiently long time interval.

8. The method of claim 7, wherein configuring the multi-modulus frequency divider and the accumulator to generate a long fractional sequence wherein the carryout signal of the accumulator repeats following a sufficiently long time interval further comprises, setting an integer division ratio input to be substantially large and setting a denominator of the fractional division ratio to be substantially large.

9. The method of claim 1, wherein the period of the first oscillator circuit is less than the period of the second oscillator circuit, and wherein calibrating a second oscillator circuit relative to the first oscillator circuit by adjusting a period of the second oscillator circuit until a difference between the period of the first oscillator circuit and a period of the second oscillator circuit is equal to a desired differential period between the first oscillator circuit and the second oscillator, circuit further comprises:
    setting the period of the second oscillator circuit to be substantially greater than the period of the first oscillator circuit; and
    incrementally decreasing the period of the second oscillator circuit towards the desired differential period between the first oscillator circuit and the second oscillator circuit until the period of the second oscillator circuit is equal to a desired value to establish the desired differential period between the first oscillator circuit and the second oscillator circuit.

10. The method of claim 9, wherein incrementally decreasing the period of the second oscillator circuit towards the desired differential period between the first oscillator circuit and the second oscillator circuit until the period of the second oscillator circuit is equal to a desired value to establish the desired differential period between the first oscillator circuit and the second oscillator circuit, further comprises:
    incrementally decreasing the period of the second oscillator circuit using a first step size tuning step;
    measuring a phase inversion at an output of the first oscillator circuit and at an output of the second oscillator circuit and when a phase inversion occurs;

mitigating the step size of the tuning step to a second step size tuning step;

incrementally increasing the period of the second oscillator circuit using the second step size tuning step; and continuing the method by measuring a phase inversion, mitigating the step size of the tuning step, and alternatingly incrementally decreasing and incrementally increasing the period of the second oscillator circuit until the period of the second oscillator circuit is equal to a desired value to establish the desired differential period between the first oscillator circuit and the second oscillator circuit.

11. The method of claim 1, wherein the period of the first oscillator circuit is greater than the period of the second oscillator circuit, and wherein calibrating a second oscillator circuit relative to the first oscillator circuit by adjusting a period of the second oscillator circuit until a difference between the period of the first oscillator circuit and a period of the second oscillator circuit is equal to a desired differential period between the first oscillator circuit and the second oscillator circuit, further comprises:

setting the period of the second oscillator circuit to be substantially less than the period of the first oscillator circuit; and incrementally increasing the period of the second oscillator circuit towards the desired differential period between the first oscillator circuit and the second oscillator circuit until the period of the second oscillator circuit is equal to a desired value to establish the desired differential period between the first oscillator circuit and the second oscillator circuit.

12. The method of claim 11, wherein incrementally increasing the period of the second oscillator circuit towards the desired differential period between the first oscillator circuit and the second oscillator circuit until the period of the second oscillator circuit is equal to a desired value to establish the desired differential period between the first oscillator circuit and the second oscillator circuit, further comprises:

incrementally increasing the period of the second oscillator circuit using a first step size tuning step;

measuring a phase inversion at an output of the first oscillator circuit and at an output of the second oscillator circuit and when a phase inversion occurs;

mitigating the step size of the tuning step to a second step size tuning step;

incrementally decreasing the period of the second oscillator circuit using the second step size tuning step; and continuing the method by measuring a phase inversion, mitigating the step size of the tuning step, and alternatingly incrementally increasing and incrementally decreasing the period of the second oscillator circuit until the period of the second oscillator circuit is equal to a desired value to establish the desired differential period between the first oscillator circuit and the second oscillator circuit.

13. The method of claim 6, wherein calibrating the phase compensation circuit of the fractional N-frequency divider using the calibration control word to modify each of the plurality of accumulator control words to generate a modified control word that is used to reduce the fractional spurious signals in the output signal of the fractional N-frequency divider, further comprises updating a look-up-table to generate the modified control word.

14. The method of claim 1, wherein calculating, for each of a plurality of accumulator control words from the accumulator, a calibration control word using the first oscillator circuit, the calibrated second oscillator circuit, a phase compensation circuit of the fractional N-frequency divider and a fraction word input to the accumulator, further comprising:

measuring a delay of the phase compensation circuit using the first oscillator circuit and the calibrated second oscillator circuit;

comparing the measured delay of the phase compensation circuit to an expected delay; and calculating the calibration control word based upon the difference between the measured delay and the expected delay, for each of the plurality of accumulator control words.

15. A fractional N-frequency divider having a reduced fractional spurious output signal, the fractional N-frequency divider comprising:

a multi-modulus frequency divider to receive an input signal and to generate a fractional frequency divider output signal;

an accumulator coupled to receive the fractional frequency divider output signal from the multi-modulus frequency divider and a fraction word input, the accumulator to provide a carryout signal to the multi-modulus frequency divider, wherein the multi-modulus frequency divider and the accumulator are configured to generate, in response to the input signal and the fraction word input, a substantially jitter-free calibration time window defined by the carryout signal of the accumulator and the multi-modulus frequency divider output signal;

an oscillator calibration circuit coupled to the accumulator, the oscillator calibration circuit for determining a period of a first oscillator circuit by counting the number of cycles of the first oscillator circuit during the calibration time window and for calibrating a second oscillator circuit relative to the first oscillator circuit by adjusting a period of the second oscillator circuit until a difference between the period of the first oscillator circuit and a period of the second oscillator circuit is equal to a desired differential period between the first oscillator circuit and the second oscillator circuit; and a phase compensation calibration circuit coupled to the accumulator, the phase compensation calibration circuit to calculate, for each of a plurality of accumulator control words, a calibration control word using the first oscillator circuit, the calibrated second oscillator circuit and a phase compensation circuit of the fractional N-frequency divider and the phase compensation calibration circuit to calibrate the phase compensation circuit of the fractional N-frequency divider using the calibration control word for each of the plurality of accumulator control words, to reduce the fractional spurious signals in the fractional N-frequency divider output signal.

16. The fractional N-frequency divider of claim 15, wherein the first oscillator circuit is a ring oscillator circuit.

17. The fractional N-frequency divider of claim 15, wherein the second oscillator circuit is a ring oscillator circuit.

18. The fractional N-frequency divider of claim 15, wherein the phase compensation circuit is a phase interpolator.

19. The fractional N-frequency divider of claim 15, wherein the phase compensation circuit is a delay line circuit.

20. A fractional N-frequency synthesizer comprising:
a phase detector to receive a reference input signal;
a loop filter coupled to the phase detector;
a voltage controlled oscillator coupled to the loop filter,
a fractional-N frequency divider coupled to the voltage controlled oscillator and coupled to the phase detector, the fractional N-frequency divider comprising;

a multi-modulus frequency divider to receive an input signal and to generate a fractional frequency divided output signal;

an accumulator coupled to receive the divided output signal from the multi-modulus frequency divider and a fraction word input, the accumulator to provide a carryout signal at an output coupled to the multi-modulus frequency divider, wherein the multi-modulus frequency divider and the accumulator are configured to generate, in response to the input signal, a substantially jitter-free calibration time window defined by the carryout signal of the accumulator and the multi-modulus frequency divider output signal;

an oscillator calibration circuit coupled to the accumulator, the oscillator calibration circuit for determining a period of a first oscillator circuit by counting the number of cycles of the first oscillator circuit during the calibration time window and for calibrating a second oscillator circuit relative to the first oscillator circuit by adjusting a period of the second oscillator circuit until a difference between the period of the first oscillator circuit and a period of the second oscillator circuit is equal to a desired differential period between the first oscillator circuit and the second oscillator circuit; and a phase compensation calibration circuit coupled to the accumulator, the phase compensation calibration circuit to calculate, for each of a plurality of accumulator control words, a calibration control word using the first oscillator circuit, the calibrated second oscillator circuit and a phase compensation circuit of the fractional N-frequency divider and the phase compensation calibration circuit to calibrate the phase compensation circuit of the fractional N-frequency divider using the calibration control word for each of the plurality of accumulator control words, to reduce the fractional spurious signals in the fractional N-frequency divider output signal.

* * * * *